United States Patent
Iigai et al.

(10) Patent No.: US 6,424,210 B1
(45) Date of Patent: Jul. 23, 2002

(54) ISOLATOR CIRCUIT

(75) Inventors: Yukiya Iigai; Haruyuki Inohana; Akio Ozawa; Kazuyuki Kudo, all of Saitama (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 09/985,438

(22) Filed: Nov. 2, 2001

(30) Foreign Application Priority Data

Nov. 14, 2000 (JP) .................................... P2000-346819

(51) Int. Cl.$^7$ .................................................. G06G 7/12
(52) U.S. Cl. ............................ 327/563; 327/87; 327/89
(58) Field of Search .............................. 327/52, 54, 63, 327/65, 67, 68–70, 72–73, 77–83, 85, 87–90, 560–563

(56) References Cited

U.S. PATENT DOCUMENTS

| | | | | |
|---|---|---|---|---|
| 4,309,656 A | * | 1/1982 | Okanobu | 324/123 R |
| 5,721,507 A | * | 2/1998 | Fujii et al. | 327/303 |
| 6,014,045 A | * | 1/2000 | Behzad | 327/417 |
| 6,107,873 A | * | 8/2000 | Lorenz | 327/563 |
| 6,218,900 B1 | * | 4/2001 | Nolan | 327/52 |
| 6,249,170 B1 | * | 6/2001 | Main et al. | 327/350 |

FOREIGN PATENT DOCUMENTS

JP          10-82439          3/1998

* cited by examiner

*Primary Examiner*—My-Trang Nuton
(74) *Attorney, Agent, or Firm*—Morgan, Lewis & Bockius LLP

(57) ABSTRACT

In an isolator circuit, a first differential pair circuit compares voltages of two input signals with each other, and, in accordance with the ratio of the voltages, currents flow through two resistors respectively connected to two output terminals of the first differential pair circuit. A current comparison circuit compares the currents respectively flowing through the two resistors, and outputs a voltage corresponding to a result of the comparison. A second differential pair circuit compares the voltage output from the current comparison circuit with a reference voltage, and a negative feedback is conducted so that the currents flowing through the two resistors are equal to each other. Unlike the conventional art, an isolator circuit can be configured without disposing buffer circuits.

5 Claims, 3 Drawing Sheets

ISOLATOR CIRCUIT

BACKGOUND OF THE INVENTION

1. Field of the Invention

The present invention relates to an isolator circuit which isolates a reference potential from another reference potential on the side of an input signal.

2. Description of the Related Art

An isolator circuit of this kind is known as a circuit constituting a part of a balanced amplifying circuit, as disclosed in, for example, JP-A-10-082439. FIG. 3 shows a conventional isolator circuit configured by an operational amplifier and resistors R. In this configuration, when input signals Vin(+) and Vin(−) are input in balance to the non-inverting input terminal (+) and the inverting input terminal (−) of the operational amplifier through the resistors R, respectively, a signal corresponding to the voltage difference between the signals is output from an output terminal of the operational amplifier. As a result, common mode noises contained in the input signals Vin(+) and Vin(−) can be eliminated therefrom.

In such an isolator circuit, in order to lower the noise voltage, resistors of a low resistance are usually used as the resistors R. When the resistors R have a low resistance, the operational amplifier must be provided with a large load driving capability, and hence the input impedance is low. Therefore, buffer circuits are connected through the resistors R to the non-inverting input terminal (+) and the inverting input terminal (−) of the operational amplifier, respectively.

In the conventional isolator circuit, the connection of the buffer circuits to the non-inverting input terminal (+) and the inverting input terminal (−) of the operational amplifier increases the current consumption and enlarges the circuit scale.

As a result, when the conventional isolator circuit is incorporated into, for example, an IC, there arise problems in that the current consumption of the IC is increased, and that the occupied area of the isolator circuit in the IC is increased to impede the miniaturization of the IC.

SUMMARY OF THE INVENTION

It is an object of the invention to provide an isolator circuit which solves the problems, and consumes a small amount of a current, and in which the circuit scale is small.

In order to attain the object, according to a first aspect of the invention, an isolator circuit comprises: a first differential pair circuit which compares voltages of two input signals with each other; resistors which are connected to two output terminals of the first differential pair circuit, respectively; a current comparison circuit which compares currents respectively flowing through the two resistors to output a voltage corresponding to a result of the comparison; and a second differential pair circuit which compares the voltage output from the current comparison circuit with a reference voltage, and two output terminals of the second differential pair circuit are respectively connected to the two resistors to equalize the currents flowing through the resistors.

In the thus configured invention, the first differential pair circuit compares voltages of the two input signals with each other, and, in accordance with the ratio of the voltages, currents flow through the resistors respectively connected to the two output terminals of the first differential pair circuit. The current comparison circuit compares the currents respectively flowing through the two resistors, and outputs a voltage corresponding to a result of the comparison. The second differential pair circuit compares the voltage output from the current comparison circuit with the reference voltage, and a negative feedback is conducted so that the currents respectively flowing through the two resistors are equal to each other. Unlike the conventional art, therefore, an isolator circuit can be configured without disposing buffer circuits, and hence the current consumption is small, and the circuit scale can be made smaller. Furthermore, the common-mode rejection ratio can be set to be high.

According to a second aspect of the invention, an isolator circuit comprises: a first differential pair circuit having first and second active elements; a second differential pair circuit having third and fourth active elements; two resistors; and a current comparison circuit, a control terminal of the first active element is connected to one input terminal for a balanced input signal, an output terminal of the first active element is connected to one input terminal of the current comparison circuit, and also to one of the resistors, a control terminal of the second active element is connected to another input terminal for the balanced input signal, an output terminal of the second active element is connected to another input terminal of the current comparison circuit, and also to another one of the resistors, a control terminal of the third active element is AC-grounded, an output terminal of the third active element is connected to the output terminal of the first active element, a control terminal of the fourth active element is connected to an output terminal of the current comparison circuit, and an output terminal of the fourth active element is connected to the output terminal of the second active element.

In the thus configured invention, the first differential pair circuit compares one voltage of the balanced input signal which is applied from the one input terminal for the balanced input signal to the control terminal of the first active element, with the other voltage of the balanced input signal which is applied from the other input terminal for the balanced input signal to the control terminal of the second active element, and currents corresponding to a result of the comparison flow through the two resistors, respectively. The current comparison circuit compares the currents with each other, and outputs a voltage corresponding to a result of the comparison. The output voltage is applied to the control terminal of the fourth active element, and a reference voltage is applied to the control terminal of the third active element. The second differential pair circuit compares the voltages with each other. On the basis of a result of the comparison, a negative feedback is conducted so that the currents respectively flowing through the two resistors are equal to each other. Unlike the conventional art, an isolator circuit can be configured without disposing buffer circuits. Therefore, the current consumption is small, and the circuit scale can be made smaller. Furthermore, the common-mode rejection ratio can be set to be high.

A third aspect of the invention is configured so that, in the isolator circuit of the second aspect of the invention, the first to fourth active elements are transistors.

A fourth aspect of the invention is configured so that, in the isolator circuit of the second or third aspect of the invention, a constant voltage is applied to the control terminal of the second active element. Therefore, the constant voltage applied to the control terminal of the third active element can be used as the reference voltage which is to be compared with the output voltage.

DETAILED DESCRIPTION OF THE PREFERRED EMBODIMENTS

Hereinafter, preferred embodiments of the invention will be described with reference to the accompanying drawings.

Figure 1:
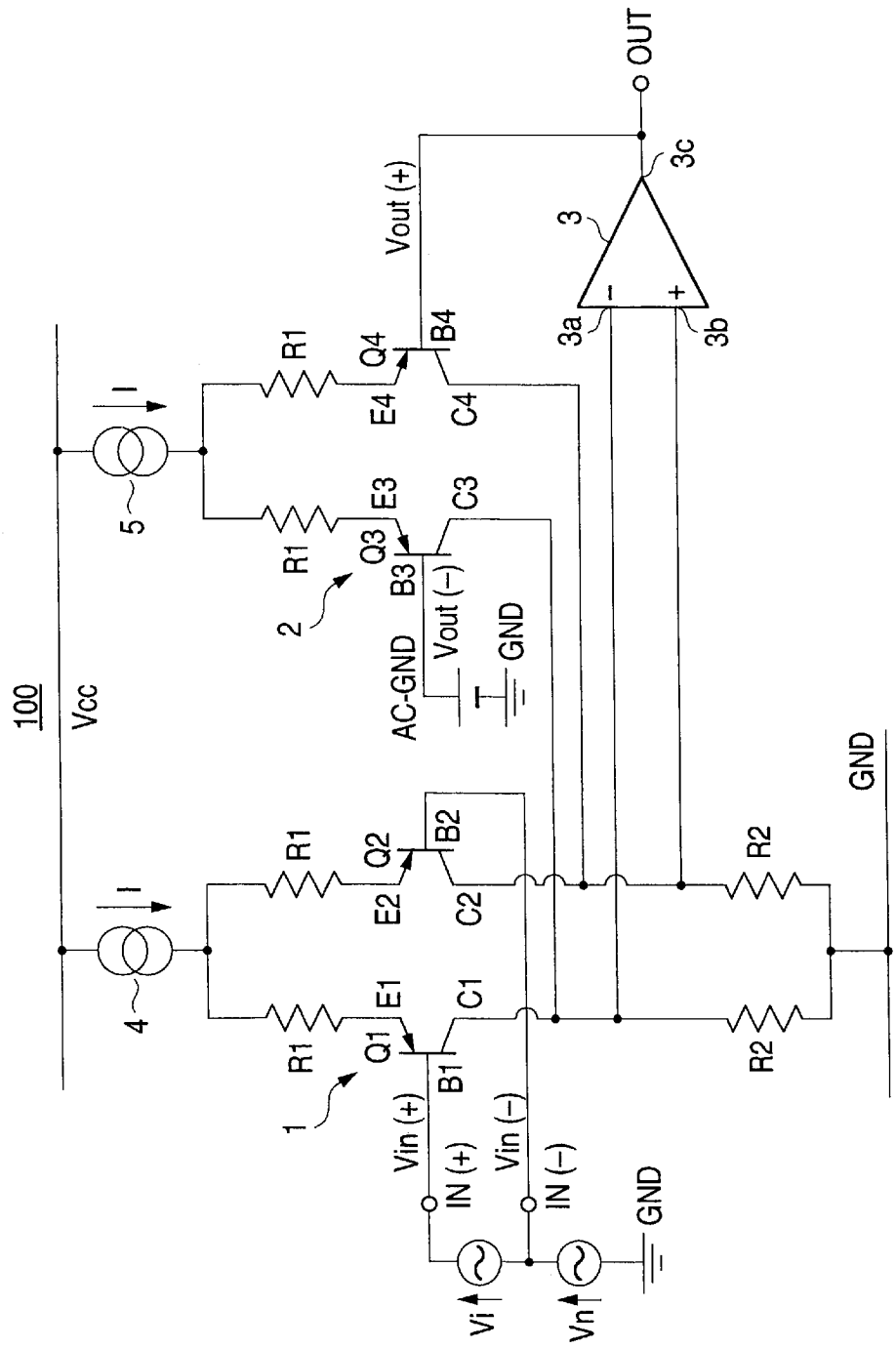
FIG. 1 is a diagram showing an embodiment of the isolator circuit of the invention.

FIG. 1 shows an embodiment of the isolator circuit of the invention.

As shown in FIG. 1, the isolator circuit 100 includes: a first differential pair circuit 1 having a transistor Q1 serving as a first active element, and a transistor Q2 serving as a second active element; a second differential pair circuit 2 having a transistor Q3 serving as a third active element, and a transistor Q4 serving as a fourth active element; a known operational amplifier 3 serving as a current comparison circuit; and resistors R2.

In the transistor Q1 of the first differential pair circuit 1, a base terminal B1 serving as a control terminal is connected to an input terminal IN(+), a collector terminal C1 serving as an output terminal is connected to an inverting terminal 3a of the operational amplifier 3, and grounded through one of the resistors R2, and an emitter terminal E1 is connected to a constant current source 4 via a resistor R1. In the transistor Q2 of the first differential pair circuit 1, a base terminal B2 serving as a control terminal is connected to an input terminal IN(−), a collector terminal C2 serving as an output terminal is connected to a non-inverting terminal 3b of the operational amplifier 3, and grounded through the other resistor R2, and an emitter terminal E2 is connected to the constant current source 4 via another resistor R1. In the first differential pair circuit 1, an input voltage Vin(+) applied to the base terminal B1 of the transistor Q1 is compared with an input voltage Vin(−) applied to the base terminal B2 of the transistor Q2.

In the transistor Q3 of the second differential pair circuit 2, a base terminal B3 serving as a control terminal is AC-grounded, a collector terminal C3 serving as an output terminal is connected to the collector terminal C1 of the transistor Q1 of the first differential pair circuit 1, and an emitter terminal E3 is connected to a constant current source 5 via a further resistor R1. In the transistor Q4 of the second differential pair circuit 2, a base terminal B4 serving as a control terminal is connected to an output terminal 3c of the operational amplifier 3, a collector terminal C4 serving as an output terminal is connected to the collector terminal C2 of the transistor Q2 of the first differential pair circuit 1, and an emitter terminal E4 is connected to the constant current source 5 via a further resistor R1. In the second differential pair circuit 2, a reference voltage Vout(−) applied to the base terminal B3 of the transistor Q3 is compared with an output voltage Vout(+) applied to the base terminal B4 of the transistor Q4.

The operational amplifier 3 compares the voltage applied to the inverting terminal 3a with that applied to the non-inverting terminal 3b, and supplies the difference voltage between the voltages as the output voltage Vout(+) to the output terminal 3c. The voltage applied to the inverting terminal 3a is proportional to the value of the current flowing through the one resistor R2 connected to the collector terminal C1 of the transistor Q1, and that applied to the non-inverting terminal 3b is proportional to the value of the current flowing through the other resistor R2 connected to the collector terminal C2 of the transistor Q2. As a result, the comparison conducted by the operational amplifier 3 is equal to comparing of the currents respectively flowing through the resistors R2.

In the above configuration, the input voltage Vin(+) due to the voltage Vi of the balanced input signal is applied from the input terminal IN(+) to the base terminal Bi of the transistor Q1, and the input voltage Vin(−) due to the voltage Vi of the balanced input signal is applied to the base terminal B2 of the transistor Q2. The first differential pair circuit 1 compares the input voltages Vin(+) and Vin(−) with each other. On the basis of the ratio of the input voltages Vin(+) and Vin(−), currents flow into the one resistor R2 connected to the collector terminal C1 of the transistor Q1, and the other resistor R2 connected to the collector terminal C2 of the transistor Q2, respectively. The voltages which are respectively applied to the inverting terminal 3a and the non-inverting terminal 3b by the currents are compared with each other by the operational amplifier 3. The difference voltage between the voltages is supplied as the output voltage Vout(+) to the output terminal 3c.

The output voltage Vout(+) which is output in this manner is applied to the base terminal B4 of the transistor Q4. On the other hand, the reference voltage (DC bias) Vout(−) is applied to the base terminal B3 of the transistor Q3, so that the second differential pair circuit 2 compares the reference voltage Vout(−) with the output voltage Vout(+). When there is no common mode component Vn, the reference voltage Vout(−) is equal in potential to the input voltage Vin(−) of the balanced input signal. On the basis of the ratio of the reference voltage Vout(−) and the output voltage Vout(+), current flow into the one resistor R2 connected to the collector terminal C3 of the transistor Q3, and the other resistor R2 connected to the collector terminal C4 of the transistor Q4, respectively (negative feedback).

As a result, the current flowing through the one resistor R2 connected to the collector terminal C3 of the transistor Q3 (i.e., connected to the collector terminal C1 of the transistor Q1) is equal in level to that flowing through the other resistor R2 connected to the collector terminal C4 of the transistor Q4 (i.e., connected to the collector terminal C2 of the transistor Q2) . Specifically, the input voltage Vin (+)—the input voltage Vin(−)=the output voltage Vout(+)—the reference voltage Vout(−), with the result that the currents respectively flowing through the resistors R2 are equal to each other.

Therefore, in the case where the voltage Vi of the balanced input signal does not contain the common mode component Vn, for example, the input voltage Vin(−) and the reference voltage (DC bias) Vout(−) are equal in potential to each other. Consequently, the input voltage Vin(+) and the output voltage Vout(+) are equal in potential to each other.

By contrast, in the case where the voltage Vi of the balanced input signal contains the common mode component Vn, the first differential pair circuit 1 causes a current due to the component Vn to flow in the same manner through both the one resistor R2 connected to the collector terminal C1 of the transistor Q1 and the other resistor R2 connected to the collector terminal C2 of the transistor Q2. Therefore, a potential difference due to the current is not produced between the collector terminal C1 of the transistor Q1 and the collector terminal C2 of the transistor Q2, so that the common mode component Vn is eliminated and only the voltage Vi of the balanced input signal appears as the output voltage Vout(+) at the output terminal 3c of the operational amplifier 3. The level of the common mode voltage to which the common mode component Vn is eliminated can be determined by selecting the value of the resistors R1.

For example, the isolator circuit 100 serves as a so-called ground isolator circuit which, in the case where devices such as a head unit and a CD changer are connected via long wires as in a car audio system and a potential difference is produced among reference potentials of the devices, can be connected to a signal line to isolate the reference potentials of the devices from one another.

As described above, according to the isolator circuit 100 of the embodiment, comparison of the input voltage Vin(+) is compared with the input voltage Vin(−), and that of the reference voltage Vout(−) with the output voltage Vout(+) are conducted by the two differential pair circuits 1 and 2, and the operational amplifier 3 controls the output voltage Vout(+) so that currents respectively flowing through the two resistors R2 are equal to each other, thereby enabling the reference potential to be isolated. Unlike a conventional isolator circuit, therefore, an isolator circuit can be configured without disposing buffer circuits, so that the circuit scale can be made smaller (than a conventional isolator circuit by a size corresponding to two operational amplifiers) and the current consumption can be made small.

In the isolator circuit 100 shown in FIG. 1, when the voltage Vi of the balanced input signal is set to Vi=0, only the common mode component Vn is input to the input voltage Vin(+) and the input voltage Vin(−). At this time, in the first differential pair circuit 1, the base voltages of both the transistors Q1 and Q2 are simultaneously changed in the same manner, and hence the input impedance is infinite (because the collector current is not changed even when the base voltage is changed). Even when the common mode input voltage is changed, therefore, the impedances of both the inputs are not changed. As a result, variations of the common-mode rejection ratio are related only to those of the transistor characteristics of the first differential pair circuit 1 and those of the emitter resistances, so that the common-mode rejection ratio (CMMR) can be set to be high.

Figure 2:
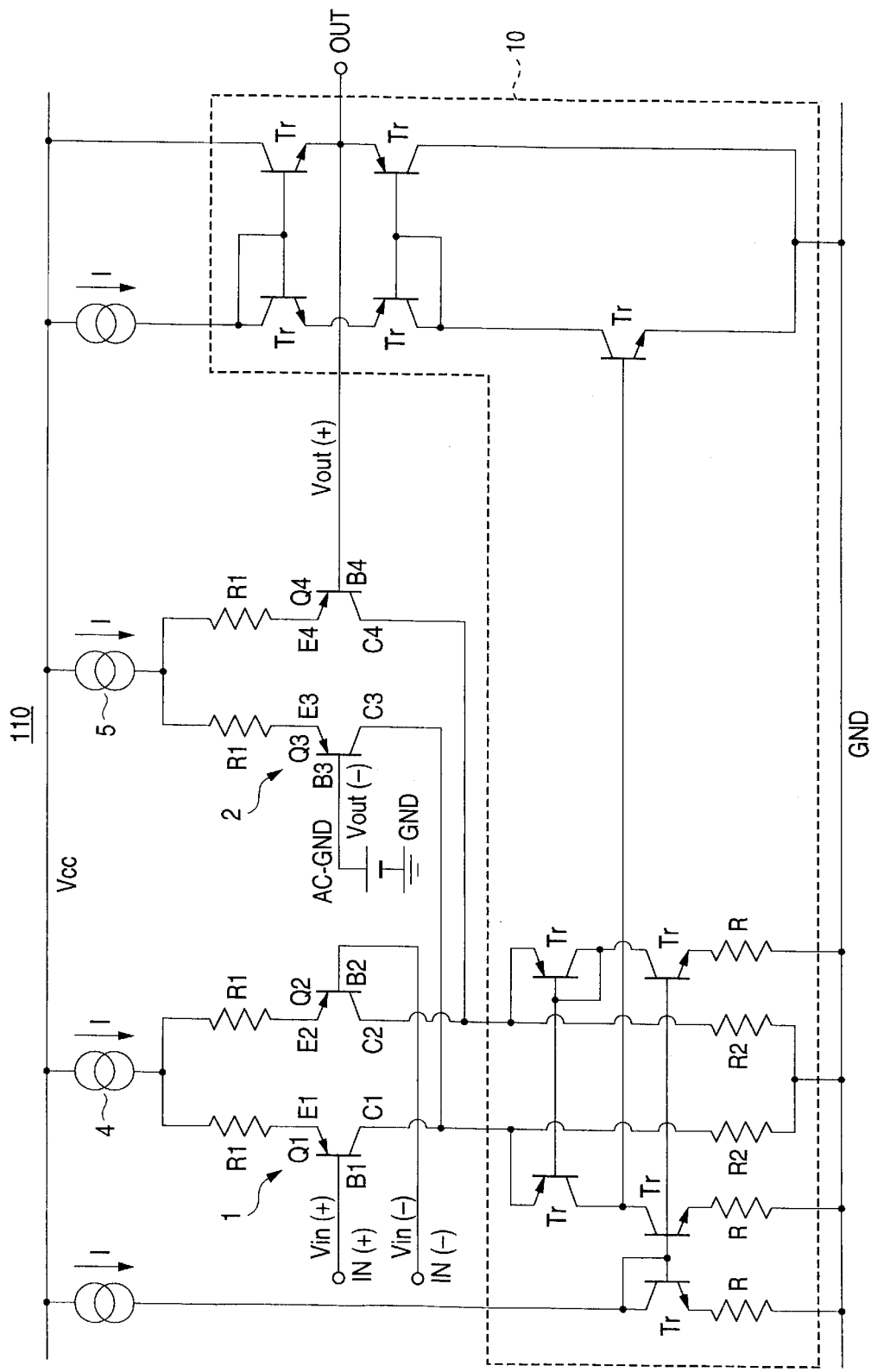
FIG. 2 is a diagram showing another embodiment of the isolator circuit of the invention.
Figure 3:
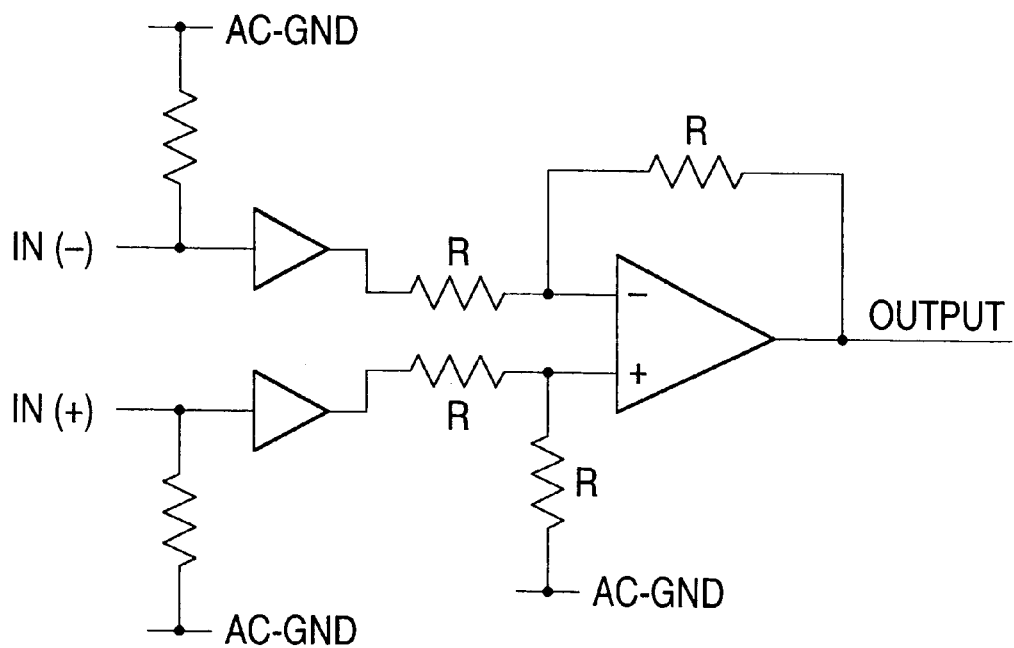
FIG. 3 is a diagram showing a conventional isolator circuit.

In the embodiment described above, the operational amplifier 3 is applied to the current comparison circuit. However, the invention is not restricted to this. As shown in FIG. 2, for example, an isolator circuit may be configured so as to dispose a current comparison circuit 10 comprising a current mirror circuit. In the isolator circuit 110, the current comparison circuit 10 operates in the same manner as the operational amplifier 3 of the isolator circuit 100 which has been described with reference to FIG. 1, and hence it is possible to attain the same effects as those of the isolator circuit 100 of FIG. 1. Moreover, the circuit scale can be made smaller as compared with the isolator circuit 100.

In the embodiment described above, transistors are used as active elements in the first and second differential pair circuits 1 and 2. In place of this, the differential pair circuits may be configured by using FETs (Field Effect transistors).

As described above, according to the invention, the current comparison circuit controls the output voltage so that currents respectively flowing through the two resistors R2 connected to the differential pair circuits are equal to each other, and the reference potential can be isolated. Unlike a conventional isolator circuit, therefore, the isolator circuit can be configured without disposing buffer circuits, so that the circuit scale can be made smaller and the current consumption can be made small. Furthermore, the common-mode rejection ratio can be set to be high.

What is claimed is:

1. An isolator circuit, comprising:
    a first differential pair circuit which compares voltages of two input signals with each other;
    resistors which are connected to two output terminals of said first differential pair circuit, respectively;
    a current comparison circuit which compares currents respectively flowing through said resistors to output a voltage corresponding to a result of the comparison; and
    a second differential pair circuit which compares the voltage output from said current comparison circuit with a reference voltage;
    wherein two output terminals of said second differential pair circuit are respectively connected to said resistors to equalize the currents flowing through said resistors.

2. An isolator circuit comprising:
    a first differential pair circuit having first and second active elements;
    a second differential pair circuit having third and fourth active elements;
    resistors; and
    a current comparison circuit;
    wherein a control terminal of said first active element is connected to one input terminal for a balanced input signal, an output terminal of said first active element is connected to one input terminal of said current comparison circuit, and also to one of said resistors;
    wherein a control terminal of said second active element is connected to another input terminal for the balanced input signal, an output terminal of said second active element is connected to another input terminal of said current comparison circuit, and to another one of said resistors;
    wherein a control terminal of said third active element is AC-grounded, an output terminal of said third active element is connected to said output terminal of said first active element; and
    wherein a control terminal of said fourth active element is connected to an output terminal of said current comparison circuit, and an output terminal of said fourth active element is connected to said output terminal of said second active element.

3. An isolator circuit according to claim 2, wherein said first to fourth active elements are transistors.

4. An isolator circuit according to claim 2, wherein a constant voltage is applied to said control terminal of said second active element.

5. An isolator circuit according to claim 3, wherein a constant voltage is applied to said control terminal of said second active element.

* * * * *